(12) United States Patent
Guimaraes

(10) Patent No.: US 7,268,715 B2
(45) Date of Patent: Sep. 11, 2007

(54) GAIN CONTROL IN A SIGNAL PATH WITH SIGMA-DELTA ANALOG-TO-DIGITAL CONVERSION

(75) Inventor: Homero L. Guimaraes, Round Lake Beach, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/977,010

(22) Filed: Oct. 29, 2004

(65) Prior Publication Data

US 2006/0092059 A1    May 4, 2006

(51) Int. Cl.
  *H03M 3/00*    (2006.01)
  *H03M 1/12*    (2006.01)
(52) U.S. Cl. .................... 341/143; 341/155
(58) Field of Classification Search ........... 341/143, 341/139, 144, 155; 375/345
  See application file for complete search history.

(56) References Cited

U.S. PATENT DOCUMENTS

| | | | | |
|---|---|---|---|---|
| 5,030,952 | A * | 7/1991 | Ledzius et al. | 341/143 |
| 5,134,401 | A * | 7/1992 | McCartney et al. | 341/143 |
| 5,142,286 | A * | 8/1992 | Ribner et al. | 341/143 |
| 5,541,600 | A * | 7/1996 | Blumenkrantz et al. | 341/139 |
| 5,585,801 | A * | 12/1996 | Thurston | 341/143 |
| 6,002,352 | A * | 12/1999 | El-Ghoroury et al. | 341/139 |
| 6,005,506 | A * | 12/1999 | Bazarjani et al. | 341/143 |
| 6,437,718 | B1 * | 8/2002 | Oyama et al. | 341/143 |
| 6,498,819 | B1 * | 12/2002 | Martin | 375/345 |
| 6,507,301 | B2 * | 1/2003 | Locher | 341/143 |
| 6,567,025 | B2 * | 5/2003 | Schreier et al. | 341/143 |
| 6,577,258 | B2 * | 6/2003 | Ruha et al. | 341/143 |
| 6,670,901 | B2 * | 12/2003 | Brueske et al. | 341/139 |
| 6,822,595 | B1 * | 11/2004 | Robinson | 341/144 |
| 6,864,818 | B1 * | 3/2005 | Hezar | 341/143 |
| 2002/0181568 | A1 * | 6/2001 | Prater | |

FOREIGN PATENT DOCUMENTS

WO    WO 02/09292 A2    1/2002

* cited by examiner

*Primary Examiner*—Jean Bruner Jeanglaude
(74) *Attorney, Agent, or Firm*—Brinks Hofer Gilson & Lione

(57) ABSTRACT

Automatic gain control is provided in a sigma-delta analog-to-digital converter. The automatic gain control is entirely or partly provided by an amplifier and an attenuator within the sigma-delta analog-to-digital converter. The amplifier within the sigma-delta time continuous loop prior to quantization and an attenuator in the feedback prior to summation with incoming signals. Scaling within the sigma-delta analog-to-digital converter results in lower current requirements for automatic gain control without disturbing or minimizing disturbance of the stability of a sigma-delta topology. By providing at least part of the automatic gain within the analog-to-digital converter, the specifications or requirements of the LNA or baseband amplifiers may be reduced or limited.

26 Claims, 1 Drawing Sheet

GAIN CONTROL IN A SIGNAL PATH WITH SIGMA-DELTA ANALOG-TO-DIGITAL CONVERSION

BACKGROUND

The present invention relates to gain control in a radio receiver path. In particular, gain control is provided in a signal path with a sigma-delta analog-to-digital converter.

Gain control is provided in receivers, such as receivers for mobile cellular telephones. Automatic gain control promotes the most efficient use of the whole dynamic range of an analog-to-digital converter in the receive path. The automatic gain control allows the use of the receiver in various propagation conditions (as fading, etc), maximizing the signal-to-noise ratio at the input of the Analog-to-digital converter and avoiding clipping along the receiver line-up. Gain normally is provided by analog baseband gain stages in the receiver back-end, and in the receiver front-end it is provided by RF Low-noise amplifiers (LNA) and mixers.

A variable gain amplifier after the mixer provides gain control in the analog baseband stages. An example of a common post-mixer amplifier (PMA) is a simple inverting amplifier with the gain set by the ratio of the feedback resistor (Rf) to the input resistor (Ri). The great amount of gain variation (dynamic range) to be provided by this single amplifier would require a great amount of current. Greater dynamic range implies a large variation of the feedback resistor, and, by consequence, the operational amplifier would need a higher current in order to drive the minimum resistor value correspondent to the minimum gain with a minimum distortion. The low distortion request arises because in order for the line-up to tolerate the third-order (or second-order) intermodulation components that fall in-band a high IP3 or IP2 is required. However, high quality amplifiers for dealing with distortion as well as an increasing dynamic range are more expensive in terms of current. In mobile telephones, current and expected standards require a large dynamic range. For example, the 3 G specification requires close to 90 dB of signal dynamic range. Of course this huge dynamic range requirement would be divided between the RF and low-frequency analog blocks. However, since the RF blocks cannot have as large gain variations as the baseband blocks due to instability of RF blocks as the gain changes, most of the gain variation normally is assigned to the baseband analog blocks. For example, a PMA has a voltage gain variation range between −12 dB to 10 dB, implementing a 22 dB AGC dynamic range. An operational-amplifier based PMA that provides a gain from −12 dB to 10 dB needs to vary the feedback resistor from 502 ohms to 6.3 k. The operational-amplifier would need a large current to drive this low resistance of 502 ohms when the gain is −12 dB. As a result, substantial current is needed in the line-up. Requiring extra current may reduce the battery life on a mobile telephone. While the dynamic range may be divided between the LNA and the variable gain amplifier of the baseband stage, increased requirements for the LNA or baseband amplifiers may still be undesirable.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE EMBODIMENTS

By way of introduction, the preferred embodiments described below include a signal path with automatic gain control, a sigma-delta analog-to-digital converter, and method for automatically controlling gain. The automatic gain control is entirely or partly provided by an amplifier within the sigma-delta analog-to-digital converter. The amplifier within the sigma-delta time continuous loop is prior to quantization, and an attenuator is in the feedback prior to summation with incoming signals. Scaling within the sigma-delta analog-to-digital converter results in lower current requirements for automatic gain control without disturbing or minimizing disturbance of the stability of a sigma-delta topology. By providing at least part of the automatic gain within the analog-to-digital converter, the specifications or requirements of the LNA or baseband amplifiers may be reduced or relaxed.

Scaling is provided inside a low-pass or band-pass continuous-time sigma-delta loop for implementing, at least in part, an automatic gain control function. Prior to quantization, an input signal is amplified to increase or maximize the dynamic range of the signal provided to the quantizer. In sigma-delta processing, a feedback loop is provided. The incoming signals are amplified prior to quantization. The signals output by the quantization process are fed back for summing with the input. To avoid inaccuracies in the feedback, the feedback signals are attenuated by the same factor as used for amplification. The feedback loop is divided into two parts, a part with a variable attenuation and a part of the loop with the variable gain. By both amplifying and attenuating the signal within the feedback loop by the same factor, the internal loop signal dynamics within the sigma-delta process are maintained. The sigma-delta creation may then use known design procedures since from the loop design point of view the amplification/attenuation scaling is transparent. An amplifier and attenuators are then added to the sigma-delta feedback loop for implementing at least part of an automatic gain control.

Figure 1:
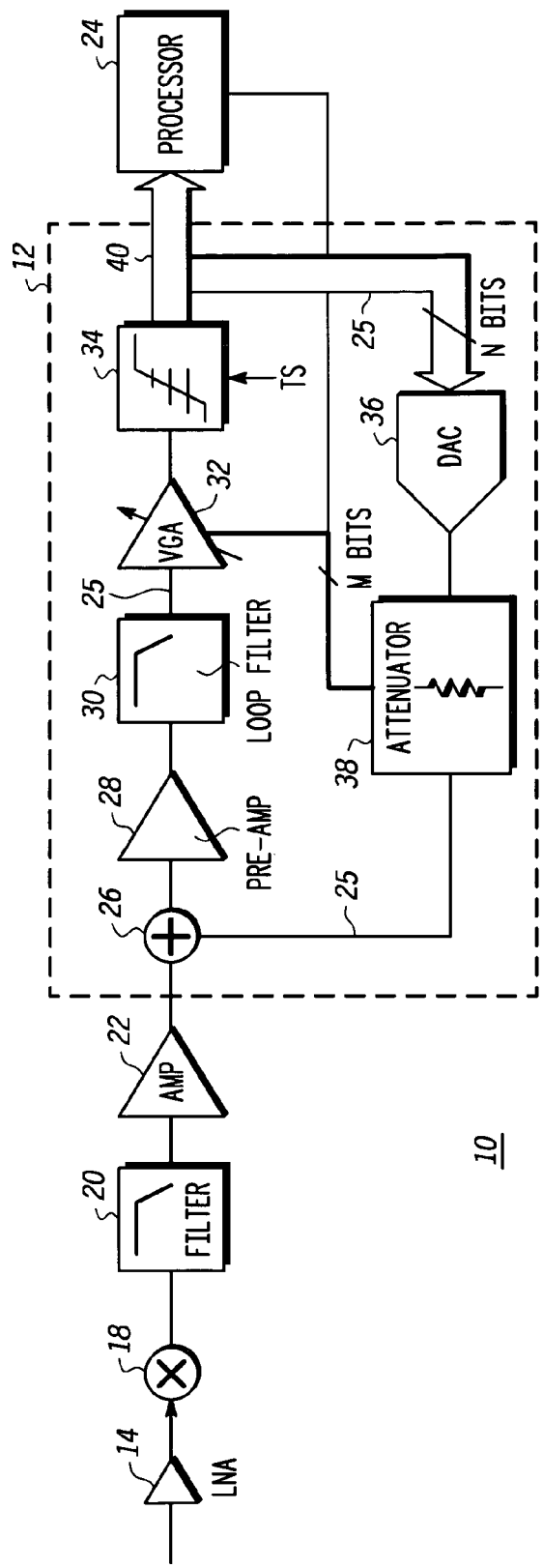
FIG. 1 is a block diagram of one embodiment of a signal path with a sigma-delta analog-to-digital converter.

FIG. 1 shows one embodiment of a signal path 10 for automatic gain control. The signal path 10 includes a sigma-delta analog-to-digital converter 12, a low-noise amplifier (LNA) 14, a mixer 18, a filter 20, a variable gain amplifier (PMA) 22 and a baseband digital processor 24. Additional, different, or fewer components may be provided. For example, additional filters or other receive path components can be included, such as a SAW filter and an antenna. As another example, a plurality of mixers and associated analog-to-digital converters 12 are provided for in-phase and quadrature processing of the receive signals. In one embodiment, the signal path 10 is a receiver for a mobile telephone, such as a receiver path for operation pursuant to the Edge (2.75 G), WCDMA (3 G) and HSDPA (3.5 G), GSM or TD-CDMA specifications for cellular telephones. In other embodiments, the signal path 10 is part of a different type of mobile or portable device or part of a mains powered device.

The LNA 14 is a low noise amplifier, including its matching network. The LNA 14 may provide a variable gain in response to a feedback signal from the processor. Alternatively, the LNA 14 provides a set gain.

The mixer 18 is a baseband mixer, such as an analog multiplier as implemented by a Gilbert-cell topology. Other now known or later developed mixers may be used. The mixer 18 mixes the receive signal with a local oscillator signal for outputting baseband information.

The variable gain amplifier 22 is a post-mixer amplifier (PMA), such as a differential input, differential output operational amplifier inverting gain stage with a variable resistance in the feedback path. The amplifier 22 is a variable gain stage, such as an analog low noise, low distortion amplifier. The amplifier 22 increases the signal-to-noise ratio by providing gain for the baseband signal. The amplifier 22 acts to reduce or minimize the contribution of noise from the sigma-delta analog-to-digital converter 12 to the total line-up noise as seen by the antenna. The feedback resistance variation controls the gain. The gain is automatically controlled to increase the dynamic range of signals input to the sigma-delta analog-to-digital converter 12. In alternative embodiments, the variable gain amplifier is combined either with the baseband filter or another amplifying stage, has a fixed gain or is not provided.

Since the sigma-delta analog-to-digital converter 12 handles at least some of the gain variation (dynamic range) of the automatic gain control function, the variable gain amplifier 22 has reduced current requirements, resulting in more relaxed IP3/IP2 requirements or interference requirements. Higher value resistors may be provided in the amplifier feedback path. For example, the variable gain amplifier 22 provides a gain variation of only −12 dB to 0 dB (12 dB range) out of a needed 90 dB dynamic range. The Sigma-delta analog-to-digital converter 12 provides an additional gain variation of 12 dB on top of the dynamic range of the sigma-delta analog to digital converter itself (near 60 dB), helping reduce the burden on the PMA. The rest of the needed dynamic range may be provided by the RF LNA 14 and other RF stages.

The filter 20 is a resistive and capacitive filter, such as a first order mixer pole. The filter 20 is between the mixer 18 and the sigma-delta analog-to-digital converter 12 for minimizing out of band tones or spurious frequencies generated by the mixer 18.

The sigma-delta analog-to-digital converter 12 has a low or band-pass continuous-time sigma-delta loop, but other sigma-delta structures may be used. First order, second order, higher order, cascaded or combinations thereof filter structures may be used. The sigma-delta analog-to-digital converter 12 couples with the mixer 18 for converting analog signals to digital signals. The sigma-delta analog-to-digital converter 12 includes a feedback loop 25. The feedback loop 25 has a summer 26, a preamplifier 28, a loop filter 30, a variable gain amplifier 32, a quantizer 34, a digital-to-analog converter 36, and an attenuator 38. Additional, different or fewer components may be provided. The components may be coupled in the order shown in FIG. 1 around the feedback loop 25, but a different order may be provided. For example, the variable gain amplifier 32 may be positioned prior to the loop filter 30. The variable gain amplifier 32 may be formed as part of or separate from the preamplifier 28. In one embodiment, all or portions of the sigma-delta analog-to-digital converter 12 are integrated onto a substrate with or without other components of the signal path 10.

The summer 26 is an analog summer, an adder, a digital summer, a connection of signal traces, a differential amplifier, or other now known or later developed device for combining the analog input signals with the feedback signals. In one embodiment, the summer 26 is a differential amplifier based on an operational amplifier with signals from the attenuator 38 being input to the virtual ground nodes (nodes where the input resistors couple with both the feedback resistors and the inputs of the operational amplifiers).

The preamplifier 28 is a feedback amplifier gain stage, such as a low distortion and/or low noise preamplifier. The noise of the stages following the preamplifier (VGA, filter etc.) as seen by the adder 26 is reduced by the gain of this stage (take-over gain). In alternative embodiments, the preamplifier 28 is not provided.

The loop filter 30 is an integrator-based continuous-time loop filter, a discrete-time loop filter, combinations thereof or other now known or later developed filters. The loop filter 30 acts as a low (or band-pass) filter to the input signal and a high-pass (or band-reject) filter to quantization noise from the feedback signal. The loop filter 30 also provides baseband filtering, but separate baseband filters may be provided.

The variable gain amplifier 32 is a feedback based gain stage with a variable resistance for altering an amount of gain. In one embodiment, the variable gain amplifier 32 is a digitally programmable amplifier. The variable gain amplifier 32 of the sigma-delta analog-to-digital converter 12 may be the same or different structure than the variable gain amplifier 22 within the signal path 10. For example, the variable gain amplifier 32 is an operational amplifier with an inverting amplifier topology having differential inputs and differential outputs with variable feedback resistors. The variable gain amplifier 32 is positioned prior to the quantizer 34 and after the summer 26. The variable gain amplifier 32 is before or after the loop filter 30. By being positioned after the loop filter 30, the variable gain amplifier may have reduced current requirements by minimizing the amplitude of the spurious signals seen at its input because of the filter action. The variable gain amplifier 32 amplifies the signals input to the quantizer 34 to use the maximum or increase use of the dynamic range of the quantizer. The gain of the variable gain amplifier 32 is adjusted so that the input signal to the quantizer 34 more closely matches the range of operation of the quantizer 34. The variable gain amplifier 32 is operable to amplify an output of the sigma-delta analog-to-digital converter 12. The digital signals output by the quantizer 34 have an amplitude that is responsive to the variable gain amplifier 32. The dynamic range of the output digital information of the signal path 10 is increased in response to the gain applied by the variable gain amplifier 32.

The quantizer 34 is a clocked comparator. In one embodiment, the quantizer 34 has a peak output of one volt and is operable to output digital information in one or more bits representing sample amplitude of input analog signals. The quantizer 34 creates one digital sample per clock signal Ts. Other now known or later developed quantizers 34 may be used. The digital information output by the quantizer 34 is provided at the output 40 of the sigma-delta analog-to-digital converter 12 and is also fed along the feedback loop 25 to the digital-to-analog converter 36. The quantizer 34 compares an integrated output from the loop filter 30 to a ground or other voltage level. A D-latch outputs the resulting information on the feedback path to the digital-to-analog converter 36 as well as outputting information to the digital part (e.g., the processor 24). In one embodiment, the quantizer 34 includes a digital low-pass filter and a decimation filter for converting a one bit data stream to a multi-bit data stream with reduced quantization noise. The one bit data stream is output by a comparator to the digital-to-analog converter 36.

The digital-to-analog converter 36 of the feedback loop 25 converts the digital information to analog information for use in the error or correction signal calculation in the sigma-delta processing. Any now known or later developed digital-to-analog converter may be used. The digital-to-analog converter 36 is a one bit converter, such as a switch. The switch selects between a negative and a positive voltage and is responsive to one bit output by the quantizer 34. Alternatively, a multi-bit converter is used. The output feedback signal maintains the average output of the loop filter 30 near the reference level of the quantizer 34.

The attenuator 38 is a resistive attenuator or an active component. For example, the attenuator 38 is a digitally programmable operational-amplifier based inverting amplifier with a gain less than 1. The attenuator 38 reduces the amplitude of signals output by the digital-to-analog converter 36. The reduced amplitude signals are provided to the summer 26 for combination with input signals prior to amplification by the variable gain amplifier 32. The variable gain amplifier 32 and the attenuator 38 create high amplitude and low amplitude portions of the feedback loop 25. Between the output of the variable gain amplifier 32 and the input of the attenuator 38 is an increased amplitude section. Between the output of the attenuator 38 and the input of the variable gain amplifier 32 is a decreased or normal amplitude section. By making the amount of attenuation equal to the amount of amplification, the loop gain variation along the feedback loop 25 is normalized. The attenuation factor or amount of attenuation is equal to the amplification factor or amount of amplification. In one embodiment, the attenuator 38 is a same structure, such as an operational amplifier and resistors matched to the variable gain amplifier 32. Using matched components may compensate for process and temperature variations.

The processor 24 is a general processor, application specific integrated circuit, field programmable gate array, digital signal processor, digital circuit, combinations thereof or other now known or later developed device for controlling the gain of the variable gain amplifier 32 and the attenuation of the attenuator 38. The processor 24 receives the output information from the output 40 of the sigma-delta analog-to-digital converter 12. The output information indicates whether the gain may be adjusted to increase the dynamic range. The processor 24 automatically controls range by comparing output signals to a threshold or peak level for which the quantizer 34 is capable. For example, the quantizer is capable of a 1 volt peak output. If the output signals indicate a 0.95 or higher voltage, the gain of the variable gain amplifier 32 and the attenuation of the attenuator 38 are reduced. If the output signals are below a threshold, such as below 0.5 volts, the gain of the variable gain amplifier 32 and the attenuation of the attenuator 38 are increased. In response to a detected change based on the output signals, a digital word or value is output to the variable gain amplifier 32 and the attenuator 38. The same digital value is output to both, but separate or different control signals may be used in alternative embodiments. The variable gain amplifier 32 and the attenuator 38 alter the amount of gain and associated attenuation in response to the control from the processor 24. Since the attenuation and gain factors are substantially the same or adjusted in response to the same binary word or data, the scaling within the sigma-delta loop is transparent to the sigma-delta process.

By positioning at least part of the overall automatic gain compensation within the sigma-delta analog-to-digital converter 12, specifications for each stage or device that provides automatic gain control may have a lower current drain potential. The linearity requirements of the variable gain amplifier 32 within the feedback loop 25 are reduced as compared to the variable gain amplifier 22 prior to the sigma-delta analog-to-digital converter 12. Any non-linearity present at the output of the variable gain amplifier 32 is noise shaped by the feedback loop 25. By moving the variable gain amplifier 32 to a point after the loop filter, the linearity requirements and, thus, the current drain may be further reduced. The gain variation needed may be distributed among the stages. For example, the variable gain amplifier 22 and LNA 14 together are used to implement a certain portion of the gain control range (e.g., 2/3), and the variable gain amplifier 32 within the feedback loop 25 implements the rest of the gain control range (e.g., 1/3). Other relative values or total amount of gain may be used. The full scale of the sigma-delta analog-to-digital converter 12 is set for the maximum expected signal. For smaller signals, the sigma-delta input range is scaled down using the variable gain amplifier 32 and the attenuator 38.

Figure 2:
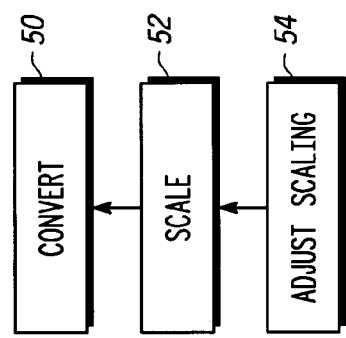
FIG. 2 is a flowchart of one embodiment of a method for automatically controlling gain with a sigma-delta analog-to-digital converter.

FIG. 2 shows one embodiment of a method for automatically controlling gain with a sigma-delta analog-to-digital converter. The method is implemented using the sigma-delta analog-to-digital converter 12 or the signal path 10 of FIG. 1. Alternatively, a different sigma-delta analog-to-digital converter is used. Additional, different or fewer acts may be provided than shown in FIG. 2.

In act 50, analog signals are converted to digital signals within a sigma-delta analog-to-digital converter loop. After passing through the continuous time loop filter, the signal is quantized by the quantizer, thus producing a single or multiple bit output stream. The single bit stream or multiple bit words generated by quantization in the sigma-delta processing is feed back through a digital-to-analog converter for summation with input signals.

In act 52, the digital signals output by the sigma-delta analog-to-digital converter are scaled inside the sigma-delta analog-to-digital converter. Analog input signals are amplified prior to quantization within the low-pass continuous time sigma-delta loop. The amplification increases the amplitude of the signals to more likely match the signals dynamic range to the range of the quantizer part of the loop of the sigma-delta analog-to-digital converter. Feedback signals are attenuated to avoid overweighting or destabilizing the feedback loop. The amount of amplification and amount of attenuation are matched. Alternatively, mismatch due to tolerance or purposeful mismatch may be provided. The scaling is provided within the sigma-delta loop.

In act 54, the scaling applied in act 52 is adjusted as a function of digital signals output by the sigma-delta analog-to-digital converter. The digital signals used for adjusting the scaling are the signal words output for further processing or other digital information, such as a bit stream output for feedback within the sigma-delta loop. The scaling is altered to increase or decrease the gain within the sigma-delta loop with a corresponding increase or decrease in attenuation within the loop. By adjusting the scaling, the gain is automatically controlled within the receive path that includes the sigma-delta analog-to-digital converter.

"Coupled" with or to as used herein includes direct coupling between two components or indirect coupling with one or more intervening components. "Or" as used herein is a logical "or."

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

I claim:

1. A sigma-delta analog-to-digital converter comprising:
   a sigma-delta feedback loop of the sigma-delta analog-to-digital converter;
   a variable gain amplifier within the sigma-delta feedback loop; and
   an attenuator within the sigma-delta feedback loop,
   wherein the attenuator is operable to attenuate by an attenuation factor and the amplifier is operable to amplify by an amplification factor, the attenuation factor equal to the amplification factor.

2. The sigma-delta analog-to-digital converter of claim 1 wherein the sigma-delta feedback loop comprises a loop filter, a quantizer, a loop digital-to-analog converter and a summer, the variable gain amplifier positioned prior to the quantizer and after the summer.

3. The sigma-delta analog-to-digital converter of claim 1 further comprising:
   an output from the sigma-delta feedback loop;
   a processor operable to receive signals on the output and operable to vary a gain of the variable gain amplifier in response to the signals.

4. The sigma-delta analog-to-digital converter of claim 3 wherein the sigma-delta feedback loop comprises a continuous-time sigma-delta loop and wherein the processor is operable to automatically control the gain.

5. The sigma-delta analog-to-digital converter of claim 1 wherein the variable gain amplifier is operable to amplify an output of the sigma-delta analog-to-digital converter, the attenuator operable to attenuate feedback signals for combination with signal input to the sigma-delta analog-to-digital converter prior to amplification by the variable gain amplifier.

6. A sigma-delta analog-to-digital converter comprising:
   a sigma-delta feedback loop;
   an attenuator within the sigma-delta feedback loop;
   a variable gain amplifier within the sigma-delta feedback loop; and
   a single digital-to-analog converter in the sigma-delta feedback loop,
   wherein the attenuator is operable to attenuate by an attenuation factor and the amplifier is operable to amplify by an amplification factor, the attenuation factor matched to the amplification factor.

7. A sigma-delta analog-to-digital converter comprising:
   a sigma-delta feedback loop;
   an attenuator within the sigma-delta feedback loop;
   a variable gain amplifier within the sigma-delta feedback loop; and
   a single loop filter in the sigma-delta feedback loop;
   wherein the attenuator is operable to attenuate by an attenuation factor and the amplifier is operable to amplify by an amplification factor, the attenuation factor matched to the amplification factor.

8. A signal path with automatic gain control, the signal path comprising:
   an analog device;
   a sigma-delta analog-to-digital converter coupled with the analog device, the sigma-delta analog-to-digital converter having a sigma-delta feedback loop, an attenuator and a variable gain amplifier within the sigma-delta feedback loop,
   wherein the attenuator is operable to attenuate by an attenuation factor and the amplifier is operable to amplify by an amplification factor, the attenuation factor equal to the amplification factor.

9. The signal path of claim 8 wherein the sigma-delta analog-to-digital converter comprises a loop filter, a quantizer, a loop digital-to-analog converter and a summer, the variable gain amplifier positioned prior to the quantizer and after the summer, and the attenuator is positioned after the loop digital-to-analog converter and before the summer.

10. The signal path of claim 9 wherein the variable gain amplifier is positioned after the loop filter.

11. The sigma-delta analog-to-digital converter of claim 1 further comprising:
    a single loop filter in the sigma-delta feedback loop.

12. The signal path of claim 8 wherein the sigma-delta feedback loop includes a single digital-to-analog converter.

13. The signal path of claim 8 further comprising:
    an output from the sigma-delta feedback loop;
    a processor operable to receive signals on the output and operable to vary a gain of the variable gain amplifier and an attenuation of the attenuator in response to the signals.

14. The signal path of claim 8 wherein the variable gain amplifier is operable to amplify an output of the signal path, the attenuator is operable to attenuate feedback signals for combination with signals input to the signal path prior to amplification by the variable gain amplifier.

15. The signal path of claim 8 further comprising:
    at least one of a LNA or an additional variable gain amplifier prior to the sigma-delta analog-to-digital converter, the one operable to partially amplify and the variable gain amplifier operable to partially amplify within the signal path.

16. The signal path of claim 8 wherein the analog device comprises a mixer, further comprising:
    a filter between the mixer and the sigma-delta analog-to-digital converter; and
    an adjustable gain amplifier between the filter and the sigma-delta analog-to-digital converter.

17. The signal path of claim 8 comprising a mobile telephone receiver.

18. The sigma-delta analog-to-digital converter of claim 1 further comprising:
    a single digital-to-analog converter in the sigma-delta feedback loop.

19. The signal path of claim 8 wherein the sigma-delta feedback loop includes a single loop filter.

20. A method for automatically controlling gain with a sigma-delta analog-to-digital converter, the method comprising:
    (a) converting analog signals to digital signals with a quantizer of the sigma-delta analog-to-digital converter; and
    (b) scaling the digital signals output by the quantizer inside the sigma-delta analog-to-digital converter;
    wherein (a) comprises quantizing and summing a sigma-delta feedback signal with input analog signals, and wherein (b) comprises amplifying and attenuating the sigma-delta feedback signal as a function of the amplification prior to quantizing, and
    wherein an amount of amplification and amount of attenuation are matched.

21. The method of claim 20 wherein (b) comprises scaling inside a low-pass or band-pass continuous-time sigma-delta loop.

22. The method of claim 20 wherein (a) comprises quantizing the analog signals, and wherein (b) comprises amplifying the analog signals prior to the quantizing.

23. The method of claim 20 further comprising:
filtering with a signal loop filter in a sigma-delta feedback loop.

24. The method of claim 20 further comprising:
converting the digital signals with a single digital-to-analog converter.

25. A method for automatically controlling gain with a sigma-delta analog-to-digital converter, the method comprising:
(a) converting analog signals to digital signals with a quantizer of the sigma-delta analog-to-digital converter;
(b) scaling the digital signals output by the quantizer inside the sigma-delta analog-to-digital converter; and
(c) adjusting the scaling of (b) as a function of the digital signals output by the sigma-delta analog-to-digital converter.

26. The method of claim 25 wherein (b) and (c) comprise automatically controlling gain in a receive path, the receive path including the sigma-delta analog-to-digital converter.

* * * * *